United States Patent
Xia et al.

(10) Patent No.: US 12,439,779 B2
(45) Date of Patent: Oct. 7, 2025

(54) DISPLAY SUBSTRATE AND MANUFACTURING METHOD THEREFOR, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Xia, Beijing (CN); Yanqiang Wang, Beijing (CN); Yuanzheng Guo, Beijing (CN); Yongzhan Han, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 499 days.

(21) Appl. No.: 17/925,855

(22) PCT Filed: Nov. 8, 2021

(86) PCT No.: PCT/CN2021/129394
§ 371 (c)(1),
(2) Date: Nov. 17, 2022

(87) PCT Pub. No.: WO2022/179178
PCT Pub. Date: Sep. 1, 2022

(65) Prior Publication Data
US 2023/0200151 A1    Jun. 22, 2023

(30) Foreign Application Priority Data
Feb. 24, 2021   (CN) .......................... 202110210135.0

(51) Int. Cl.
*H10K 59/126*  (2023.01)
*H10K 59/12*   (2023.01)
(Continued)

(52) U.S. Cl.
CPC ....... *H10K 59/126* (2023.02); *H10K 59/1201* (2023.02); *H10K 77/111* (2023.02); *H10K 2102/311* (2023.02)

(58) Field of Classification Search
CPC ............. H10K 59/126; H10K 59/1201; H10K 77/111; H10K 2102/311; H10K 59/352;
(Continued)

(56) References Cited

U.S. PATENT DOCUMENTS

| | | | |
|---|---|---|---|
| 2007/0157839 A1 | 7/2007 | Kim et al. | |
| 2010/0141877 A1 | 6/2010 | Huang et al. | |
| 2021/0167155 A1* | 6/2021 | Xu | H10K 59/126 |

FOREIGN PATENT DOCUMENTS

| | | |
|---|---|---|
| CN | 108573956 A | 9/2018 |
| CN | 108695394 A | 10/2018 |

(Continued)

OTHER PUBLICATIONS

Notification to Grant Patent Right for Invention for Chinese Patent Application No. 202110210135.0 issued by the Chinese Patent Office on Jul. 19, 2022.

(Continued)

*Primary Examiner* — J. E. Schoenholtz
(74) *Attorney, Agent, or Firm* — XSENSUS LLP

(57) ABSTRACT

A display substrate includes: a flexible light-transmitting substrate; a light-shielding layer disposed on a side of the flexible light-transmitting substrate; and a plurality of subpixels disposed on a side of the light-shielding layer away from the flexible light-transmitting substrate. The side of the flexible light-transmitting substrate has grooves. The light-
(Continued)

shielding layer includes a plurality of light-shielding patterns, and a light-shielding pattern is located in a groove. The light-shielding pattern includes a first sub-light-shielding pattern covering a side wall of the groove and a second sub-light-shielding pattern covering a bottom surface of the groove. Each sub-pixel includes a pixel driving to circuit including a plurality of transistors. An active layer of a transistor is located in the groove. Relative to the flexible light-transmitting substrate, a surface of the active layer proximate to the flexible light-transmitting substrate is lower than a surface of the first sub-light-shielding pattern away from the flexible light-transmitting substrate.

20 Claims, 9 Drawing Sheets

(51) Int. Cl.
  *H10K 77/10* (2023.01)
  *H10K 102/00* (2023.01)
(58) Field of Classification Search
  CPC ............. H10K 59/353; H10K 59/1213; H10K 59/122; H10K 59/12; Y02E 10/549; G09F 9/301
  See application file for complete search history.

(56) References Cited

FOREIGN PATENT DOCUMENTS

| | | |
|---|---|---|
| CN | 110649037 A | 1/2020 |
| CN | 111312722 A | 6/2020 |
| CN | 111816087 A | 10/2020 |
| CN | 212485328 U | 2/2021 |
| CN | 113013211 A | 6/2021 |
| JP | 2003-229283 A | 8/2003 |

OTHER PUBLICATIONS

First Office Action for Chinese Patent Application No. 202110210135.0 issued by the Chinese Patent Office on Jan. 28, 2022.

\* cited by examiner

DISPLAY SUBSTRATE AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN 2021/ 129394 filed on Nov. 8, 2021, which claims priority to Chinese Patent Application No. 202110210135.0, filed on Feb. 24, 2021, which are incorporated herein by reference in their entirety.

TECHNICAL FIELD

The present disclosure relates to the field of display technologies, and in particular, to a display substrate and a manufacturing method therefor, and a display device.

BACKGROUND

With the development of science and technology, the transparent display technology is attracting more and more attention.

A transparent display screen is able to not only display images, but also have a certain light transmittance. A scene on another side is able to be seen through the transparent display screen. Transparent display screens may be widely applied to occasions such as building outer walls, display windows, exhibition boards, airports, hotels, or stages.

SUMMARY

In an aspect, a display substrate is provided. The display substrate includes: a flexible light-transmitting substrate; a light-shielding layer disposed on a side of the flexible light-transmitting substrate; and a plurality of sub-pixels disposed on a side of the light-shielding layer away from the flexible light-transmitting substrate. The side of the flexible light-transmitting substrate has a plurality of grooves. The light-shielding layer includes a plurality of light-shielding patterns, and a light-shielding pattern in the plurality of light-shielding patterns is located in a groove in the plurality of grooves. The light-shielding pattern includes a first sub-light-shielding pattern and a second sub-light-shielding pattern. The first sub-light-shielding pattern covers a side wall of the groove, and the second sub-light-shielding pattern covers a bottom surface of the groove. Each sub-pixel includes a pixel driving circuit and a light-emitting device. The pixel driving circuit includes a plurality of transistors, and an active layer of a transistor in the plurality of transistors is located in the groove. Relative to the flexible light-transmitting substrate, a surface of the active layer proximate to the flexible light-transmitting substrate is lower than a surface of the first sub-light-shielding pattern away from the flexible light-transmitting substrate.

In some embodiments, relative to the flexible light-transmitting substrate, a surface of the active layer away from the flexible light-transmitting substrate is flush with or lower than the surface of the first sub-light-shielding pattern away from the flexible light-transmitting substrate.

In some embodiments, the groove is provided with a plurality of active layers therein. The plurality of active layers belong to transistors in at least one pixel driving circuit.

In some embodiments, an included angle between the first sub-light-shielding pattern and the second sub-light-shielding pattern is greater than or equal to 90°.

In some embodiments, the display substrate further includes a barrier layer disposed between the flexible light-transmitting substrate and the plurality of sub-pixels. The barrier layer has a plurality of openings, and the plurality of openings expose the plurality of grooves, respectively. An orthographic projection of the first sub-light-shielding pattern on the flexible light-transmitting substrate and an orthographic projection of the barrier layer on the flexible light-transmitting substrate are partially overlapped with each other, or have respective edges that are overlapped with each other.

In some embodiments, the light-shielding layer includes a metal layer. The light-shielding layer is grounded.

In some embodiments, the display substrate further includes a buffer layer disposed between the light-shielding pattern and the active layer. The buffer layer covers the first sub-light-shielding pattern and the second sub-light-shielding pattern. In a direction parallel to the flexible light-transmitting substrate, the first sub-light-shielding pattern and the active layer have a minimum distance therebetween. The minimum distance is greater than or equal to a thickness of the buffer layer.

In some embodiments, a gate of the transistor is located on a side of the active layer of the transistor away from the flexible light-transmitting substrate.

In another aspect, a manufacturing method of a display substrate is provided. The manufacturing method of the display substrate includes: providing a flexible light-transmitting film; patterning the flexible light-transmitting film to form a plurality of grooves, so as to obtain a flexible light-transmitting substrate; forming a light-shielding layer on a side of the flexible light-transmitting substrate; and forming a plurality of sub-pixels on a side of the light-shielding layer away from the flexible light-transmitting substrate. The light-shielding layer includes a plurality of light-shielding patterns, and a light-shielding pattern in the plurality of light-shielding patterns is located in a groove in the plurality of grooves. The light-shielding pattern includes a first sub-light-shielding pattern and a second sub-light-shielding pattern. The first sub-light-shielding pattern covers a side wall of the groove, and the second sub-light-shielding pattern covers a bottom surface of the groove. Each sub-pixel includes a pixel driving circuit and a light-emitting device. The pixel driving circuit includes a plurality of transistors, and an active layer of a transistor in the plurality of transistors is located in the groove. Relative to the flexible light-transmitting substrate, a surface of the active layer proximate to the flexible light-transmitting substrate is lower than a surface of the first sub-light-shielding pattern away from the flexible light-transmitting substrate.

In some embodiments, patterning the flexible light-transmitting film to form the plurality of grooves includes: forming a barrier film on a side of the flexible light-transmitting film; forming a first photoresist layer on a side of the barrier film away from the flexible light-transmitting film; patterning the first photoresist layer; patterning the barrier film using the patterned first photoresist layer as a mask to form a plurality of openings, so as to obtain a barrier layer; and patterning the flexible light-transmitting film using the barrier layer as a mask to form the plurality of grooves, so as to obtain the flexible light-transmitting substrate.

In some embodiments, patterning the flexible light-transmitting film to form the plurality of grooves includes:

forming a barrier film on a side of the flexible light-transmitting film; forming a second photoresist layer on a side of the barrier film away from the flexible light-transmitting film; patterning the second photoresist layer; patterning the barrier film using the patterned second photoresist layer as a mask to form a plurality of openings, so as to obtain a barrier layer; and patterning the flexible light-transmitting film to form the plurality of grooves, so as to obtain the flexible light-transmitting substrate.

In some embodiments, forming the light-shielding layer on the side of the flexible light-transmitting substrate includes: forming a light-shielding film on the side of the flexible light-transmitting substrate where the plurality of grooves are formed; forming a third photoresist layer on a side of the light-shielding film away from the flexible light-transmitting substrate; patterning the third photoresist layer; and patterning the light-shielding film using the patterned third photoresist layer as a mask to form the light-shielding patterns respectively located in the grooves, so as to obtain the light-shielding layer.

In some embodiments, providing the flexible light-transmitting film includes: providing a rigid substrate; and forming the flexible light-transmitting film on the rigid substrate. The manufacturing method of the display substrate further includes: removing the rigid substrate after the plurality of sub-pixels are formed.

In some embodiments, forming the plurality of sub-pixels on the side of the light-shielding layer away from the flexible light-transmitting substrate includes: forming an active film on the side of the light-shielding layer away from the flexible light-transmitting substrate; forming a fourth photoresist layer on a side of the active film away from the flexible light-transmitting substrate; patterning the fourth photoresist layer; and patterning the active film using the patterned fourth photoresist layer as a mask to obtain active layers of transistors in a plurality of pixel driving circuits in the plurality of sub-pixels that are respectively located in the grooves.

In some embodiments, forming the plurality of sub-pixels on the side of the light-shielding layer away from the flexible light-transmitting substrate further includes: forming gates of respective transistors on a side of the active layers that are respectively located in the grooves away from the flexible light-transmitting substrate.

In yet another aspect, a display device is provided. The display device includes the display substrate in any one of the above embodiments.

In some embodiments, a number of the light-shielding patterns is less than or equal to a number of the grooves.

In some embodiments, a shape of the light-shielding pattern is substantially same as a shape of the groove.

In some embodiments, in a direction perpendicular to the flexible light-transmitting substrate, a dimension component of the first sub-light-shielding pattern is in a range of 1 μm to 3 μm, inclusive.

In some embodiments, a thickness of the light-shielding layer is in a range of 50 nm to 300 nm, inclusive.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, and an actual process of a method involved in the embodiments of the present disclosure.

DETAILED DESCRIPTION

Figure 1:
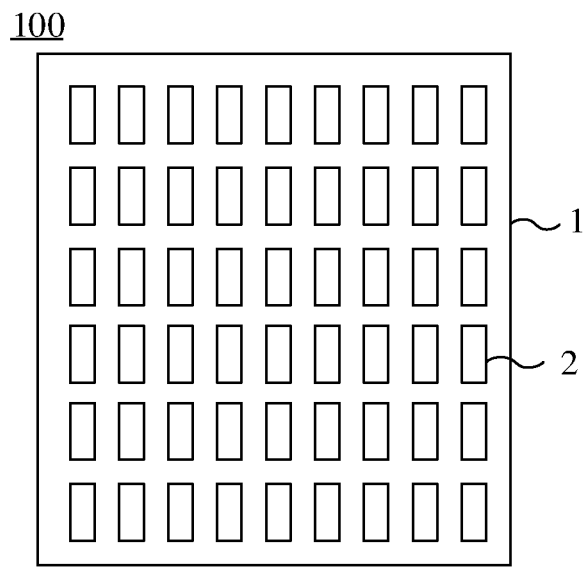
FIG. 1 is a structural diagram of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other.

The phrase "at least one of A, B and C" has the same meaning as the phrase "at least one of A, B or C", both include following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, transparent display screens are basically rigid display screens. However, the rigid display screens are difficult to be bent, which limits an application range of the transparent display screens.

Moreover, a sub-pixel in the transparent display screen includes pixel driving circuits, and the pixel driving circuit includes a plurality of transistors. External ambient light easily irradiates an active layer of the transistor, so that a carrier mobility of the active layer is reduced, thereby affecting an operating performance of the transistor, and then affecting a display quality of the transparent display screen.

Based on this, some embodiments of the present disclosure provide a display substrate. A structure of the display substrate will be schematically described below with reference to the accompanying drawings.

Figure 7:
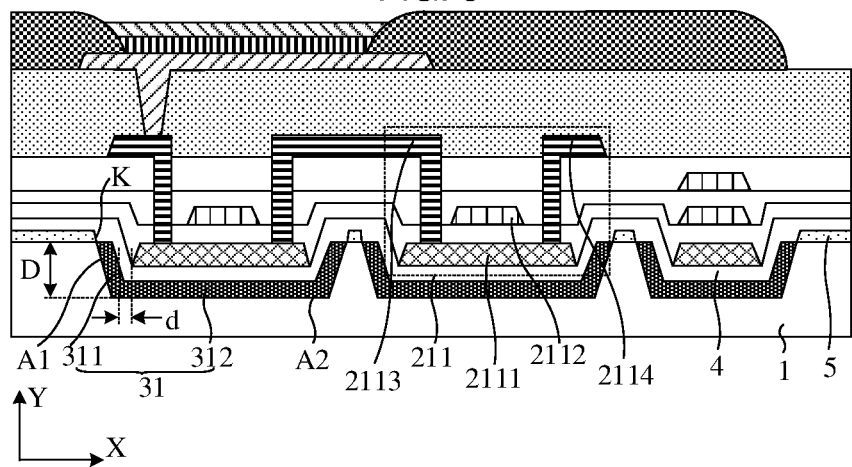
FIG. 7 is a structural diagram of another display substrate, in accordance with some embodiments of the present disclosure.
Figure 8:
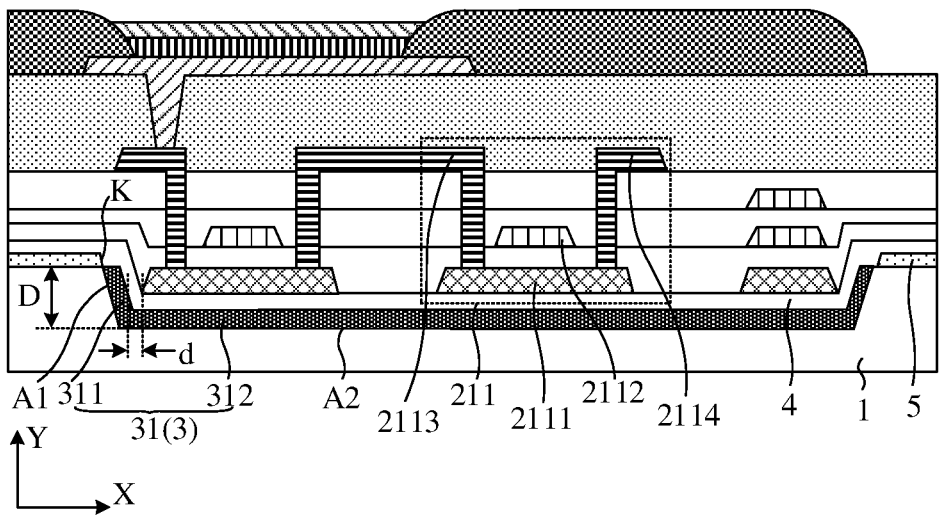
FIG. 8 is a structural diagram of yet another display substrate, in accordance with some embodiments of the present disclosure.

In some examples, as shown in FIGS. 1, 7 and 8, the display substrate 100 may include a flexible light-transmitting substrate 1.

For example, the flexible light-transmitting substrate 1 has a good flexibility, a support strength and a high light transmittance. In this way, the support strength of the flexible light-transmitting substrate 1 may be utilized to form a support for subsequently formed structures, the flexibility of the flexible light-transmitting substrate 1 may be utilized to enable the display substrate 100 to have a foldable function, and the high light transmittance of the flexible light-transmitting substrate 1 may be utilized to enable the display substrate 100 to realize transparent display, which is conducive to expanding an application range of the display substrate 100.

A material of the flexible light-transmitting substrate 1 varies, and may be set according to actual needs, as long as the display substrate 100 may have the foldable function, and may realize the transparent display.

For example, the material of the flexible light-transmitting substrate 1 may be colorless polyimide (CPI), polypropylene (PP), polyethylene (PE), or polystyrene (PS).

In some examples, as shown in FIG. 1, the display substrate 100 may further include a plurality of sub-pixels 2 disposed on a side of the flexible light-transmitting substrate 1. The plurality of sub-pixels P may, for example, be arranged in an array.

Figure 2:
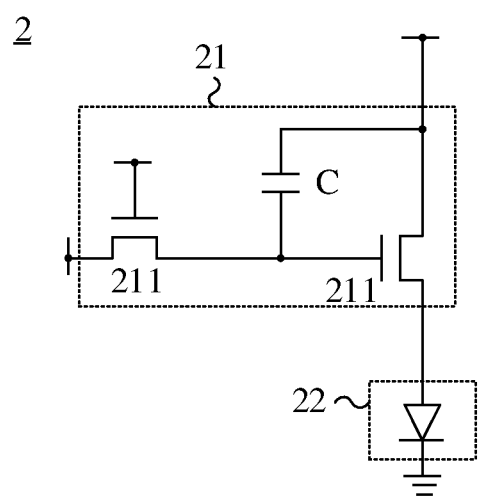
FIG. 2 is a structural diagram of a sub-pixel, in accordance with some embodiments of the present disclosure.

For example, as shown in FIG. 2, each sub-pixel 2 includes a pixel driving circuit 21 and a light-emitting device 22. The light-emitting device 22 may be disposed on a side of the pixel driving circuit 21 away from the flexible light-transmitting substrate 1, and is electrically connected to the pixel driving circuit 21. The pixel driving circuit 21 is configured to provide a driving voltage to the light-emitting device 22 electrically connected to the pixel driving circuit 21, so as to control a light-emitting state of the light-emitting device 22. In this way, light-emitting devices 22 in the plurality of sub-pixels 2 may cooperate with each other, so that the display substrate 100 is capable of displaying images.

For example, the light-emitting device 22 may be an organic light-emitting diode (OLED).

For example, as shown in FIG. 2, the pixel driving circuit 21 includes a plurality of transistors 211 and storage capacitor(s) C.

Here, a structure of the pixel driving circuit 21 varies, and may be set according to actual needs. For example, the pixel driving circuit 21 may include a structure such as "2T1C," "6T1C," "7T1C," "6T2C" or "7T2C". Here, "T" represents a transistor, a number before "T" represents the number of the transistors, "C" represents a storage capacitor, and a number before "C" represents the number of the storage capacitor(s). That is, the number of the transistors 211 included in the pixel driving circuit 21 may be determined according to the structure of the pixel driving circuit 21. As shown in FIG. 2, a schematic description will be made in an example where the pixel driving circuit 21 has the "2T1C" structure.

A structure of the transistor 211 included in the pixel driving circuit 21 varies, and may be set according to actual needs. For example, the transistor 211 may be a top-gate transistor, or the transistor 211 may be a bottom-gate transistor.

A schematic description will be made in an example where the plurality of transistors 211 included in the pixel driving circuit 21 are all top-gate transistors.

For example, as shown in FIGS. 7 and 8, the transistor 211 includes an active layer 2111 and a gate 2112. In a case where the transistor 211 is a top-gate transistor, the gate 2112 is located on a side of the active layer 2111 away from the flexible light-transmitting substrate 1.

Here, the display substrate 100 may further include gate insulating layer(s) disposed between active layers 2111 and gates 2112 of transistors 211 in a plurality of pixel driving circuits 21 in the plurality of sub-pixels 2. In this way, the active layer 2111 and the gate 2112 may be separated by the gate insulating layer(s), so that the active layer 2111 and the gate 2112 are insulated from each other, and are prevented from being short-circuited.

For example, as shown in FIGS. 7 and 8, the transistor 11 may further include a source 2113 and a drain 2114. The source 2113 and the drain 2114 may be disposed on a side of the gate 2112 away from the flexible light-transmitting substrate 1.

Here, the display substrate 100 may further include interlayer dielectric layer(s) disposed between sources 2113 and the gates 2112 of the transistors 211 in the plurality of pixel driving circuits 21 and disposed between drains 2114 and the gates 2112 of the transistors 211 in the plurality of pixel driving circuits 21. In this way, the source 2113 and the gate 2112 may be separated by the interlayer dielectric layer(s), and the drain 2114 and the gate 2112 may be separated by the interlayer dielectric layer(s), so that the source 2113 and the gate 2112 are prevented from being short-circuited, and the drain 2114 and the gate 2112 are prevented from being short-circuited.

On this basis, vias, each of which exposing a portion of an active layer 2111, are present in the gate insulating layer(s) and the interlayer dielectric layer(s). Each source 2113 may be in contact with a corresponding active layer 2111 through a corresponding via to form an electrical connection. Each drain 2114 may be in contact with a corresponding active layer 2111 through a corresponding via to form an electrical connection.

It will be noted that the transistor 211 may include the source 2113 and the drain 2114, or may not include the source 2113 and the drain 2114, which may be determined according to an actual layout design of the pixel driving circuits 21.

In some examples, as shown in FIGS. 4, 5, 7 and 8, the side of the flexible light-transmitting substrate 1 has a plurality of grooves A.

For example, as shown in FIGS. 7 and 8, the plurality of sub-pixels 2 may be disposed on the side of the flexible light-transmitting substrate 1 having the plurality of grooves A. An active layer 2111 of a transistor 211 may be located in a groove A.

This means that a groove A may be provided with active layer(s) 2111 of at least one transistor 211 therein.

For example, as shown in FIGS. 3 to 5 and 7, a groove A is provided with a single active layer 2111 therein. In this case, the number of the grooves A may be greater than or equal to the number of the active layers 2111 of the transistors 211 in the plurality of pixel driving circuits 21.

Figure 6:
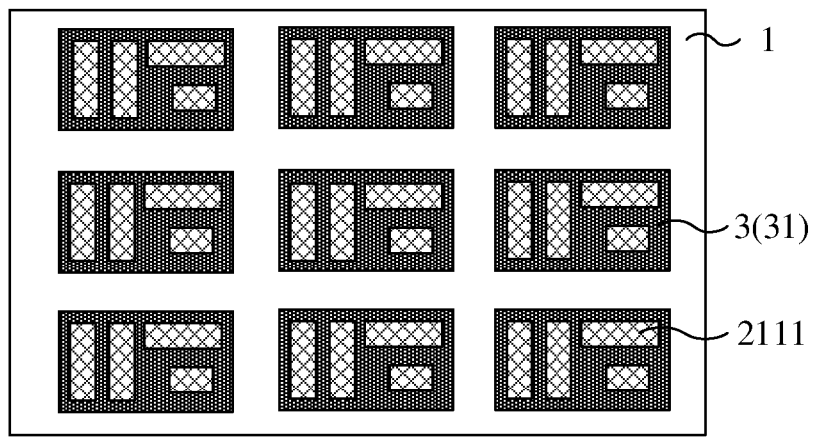
FIG. 6 is another structural diagram of a flexible light-transmitting substrate, a light-shielding layer and an active layer, in accordance with some embodiments of the present disclosure.

For another example, as shown in FIGS. 6 and 8, a groove A is provided with a plurality of active layers 2111 therein. In this case, the number of the grooves A is less than the number of the active layers 2111 of the transistors 211 in the plurality of pixel driving circuits 21. The plurality of active layers 2111 disposed in the groove A may belong to transistors 211 in at least one pixel driving circuit 21.

The plurality of active layers 2111 may belong to transistors 211 in a single pixel driving circuit 21. The plurality of active layers 2111 may belong to some or all of the plurality of transistors 211 in the pixel driving circuit 21.

The plurality of active layers 2111 may belong to transistors 211 in at least two pixel driving circuits 21. The at least two pixel driving circuits 21 may belong to adjacent sub-pixels 2 that may be sub-pixels 2 of a same color (e.g., red sub-pixels, green sub-pixels or blue sub-pixels) or sub-pixels 2 of different colors (e.g., at least two of a red sub-pixel, a green sub-pixel and a blue sub-pixel).

For example, as shown in FIGS. 4, 5, 7 and 8, each groove A includes a side wall A1 and a bottom surface A2. The side wall A1 is loop-shaped, and an end of the side wall A1 is connected to an edge of the bottom surface A2.

Figure 4:
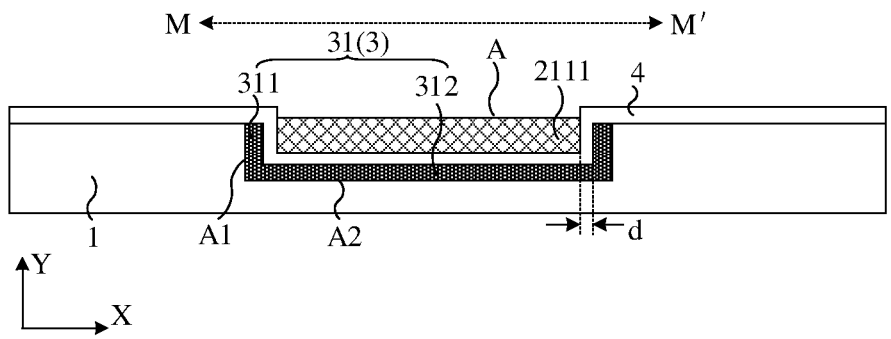
FIG. 4 is a sectional view of the structure shown in FIG. 3 taken along the M-M' direction.
Figure 5:
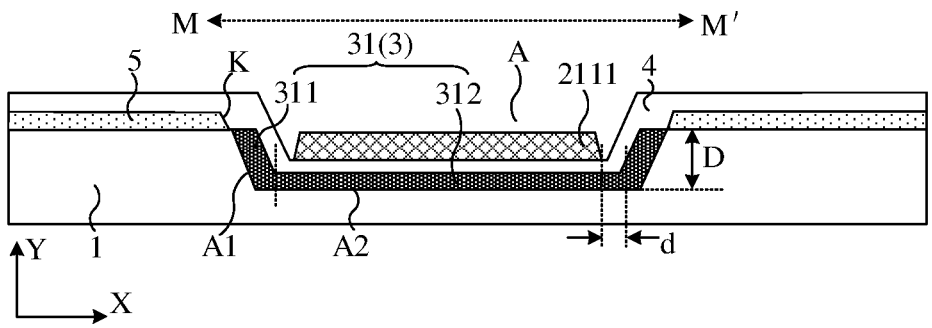
FIG. 5 is another sectional view of the structure shown in FIG. 3 taken along the M-M' direction.

A shape of a sectional view of the groove A varies, and may be set according to actual needs. For example, as shown in FIGS. 4 and 5, the sectional view of the groove A may have a rectangular or trapezoidal shape. In a case where the sectional view of the groove A have the rectangular shape, the side wall A1 and the bottom surface A2 are perpendicular to each other. In a case where the sectional view of the groove A have the trapezoidal shape, an included angle between the side wall A1 and the bottom surface A2 is greater than 90°.

A shape of a top view of the groove A varies. Since the active layer 2111 is disposed in the groove A, the shape of the top view of the groove A may be set according to an actual layout design of the active layers 2111. The shape of the top view of the groove A is substantially the same as a planar shape of the bottom surface A2 of the groove A.

Figure 3:
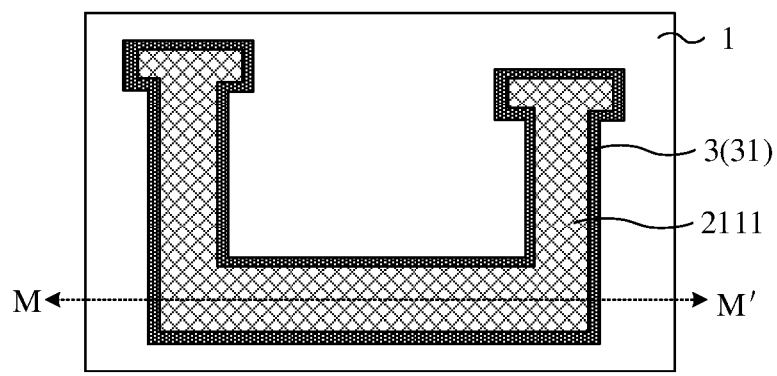
FIG. 3 is a structural diagram of a flexible light-transmitting substrate, a light-shielding layer and an active layer, in accordance with some embodiments of the present disclosure.

In a case where the active layers 2111 and the grooves A are arranged in one-to-one correspondence, the shape of the top view of the groove A may be substantially the same as a shape of an orthographic projection of the active layer 2111 on the flexible light-transmitting substrate 1. For example, the orthographic projection of the active layer 2111 on the flexible light-transmitting substrate 1 have a rectangular shape, and the top view of the groove A have a rectangular shape. The orthographic projection of the active layer 2111 on the flexible light-transmitting substrate 1 have a trapezoidal shape, and the top view of the groove A have a trapezoidal shape. As shown in FIG. 3, the orthographic projection of the active layer 2111 on the flexible light-transmitting substrate 1 has a U shape, and the top view of the groove A has a U shape.

In a case where the groove A is provided with the plurality of active layers 2111 therein, as shown in FIG. 6, the shape of the top view of the groove A may be substantially the same as an outer contour of a shape of orthographic projections of the plurality of active layers 2111 on the flexible light-transmitting substrate 1. For example, the outer contour of the shape of the orthographic projections of the plurality of active layers 2111 on the flexible light-transmitting substrate 1 is a rectangle, and the shape of the top view of the groove A is a rectangle.

Here, considering that a process of forming the groove A inevitably has certain process errors, after the groove A is formed, the side wall A1 and/or the bottom surface A2 of the groove A may not be absolutely planar. That is, the side wall A1 and/or the bottom surface A2 of the groove A may be uneven. Thus, the sectional view of the groove A may have an irregular rectangular or trapezoidal shape, and the top view of the groove A may have an irregular rectangular, trapezoidal or U shape. Here, "irregular" means that due to the process errors, the sectional view of the groove A or the top view of the groove A has a shape whose side(s) are curved segment(s) instead of straight segment(s).

In some examples, as shown in FIGS. 3 to 8, the display substrate 100 may further include a light-shielding layer 3 disposed on a side of the flexible light-transmitting substrate 1. The light-shielding layer 3 is configured to shield (e.g., absorb or reflect) light, so as to prevent the light from passing through the light-shielding layer 3 itself, thereby preventing the light from being incident from a side of the light-shielding layer 3 on another side of the light-shielding layer 3 opposite to the side of the light-shielding layer 3.

For example, the light-shielding layer 3 may be disposed on the side of the flexible light-transmitting substrate 1 having the plurality of grooves A. Based on this, the plurality of sub-pixels 2 may be disposed on a side of the light-shielding layer 3 away from the flexible light-transmitting substrate 1. Each light-shielding pattern 31 is located between a corresponding groove A and a corresponding active layer 2111.

For example, as shown in FIGS. 6 to 8, the light-shielding layer 3 includes a plurality of light-shielding patterns 31, and a light-shielding pattern 31 is located in a groove A.

The number of the light-shielding patterns 31 may be set according to actual needs. For example, the number of the light-shielding patterns 31 is less than or equal to the number of the grooves A. In a case where the number of the light-shielding patterns 31 is equal to the number of the grooves A, the light-shielding patterns 31 and the grooves A may be arranged in one-to-one correspondence.

For example, as shown in FIGS. 4, 5, 7 and 8, the light-shielding pattern 31 may include a first sub-light-shielding pattern 311 and a second sub-light-shielding pattern 312. The first sub-light-shielding pattern 311 covers the side wall A1 of the groove A, and the second sub-light-shielding pattern 312 covers the bottom surface A2 of the groove A. The first sub-light-shielding pattern 311 is loop-shaped, and an end of the first sub-light-shielding pattern 311 is connected to an edge of the second sub-light-shielding pattern 312.

As shown in FIGS. 4, 5, 7 and 8, the light-shielding pattern 31 is in direct contact with a corresponding groove A, and a shape of the light-shielding pattern 31 is the same or substantially the same as a shape of the corresponding groove A. In this way, the light-shielding pattern 31 may be formed into a groove structure with substantially the same shape as the groove A, thereby shielding an internal space enclosed by the light-shielding pattern 31 from light. The shape of the light-shielding pattern 31 may refer to the description of the shape of the groove A, and will not be repeated here.

In some examples, as shown in FIGS. 4, 5, 7 and 8, in the active layer(s) 2111 located in the groove A, relative to the flexible light-transmitting substrate 1, a surface of the active layer 2111 proximate to the flexible light-transmitting substrate 1 is lower than a surface of the first sub-light-shielding pattern 311 away from the flexible light-transmitting substrate 1.

It will be noted that considering that a process of forming the light-shielding to patterns 31 inevitably has certain process errors, after the light-shielding patterns 31 are formed, the surface of the first sub-light-shielding pattern 311 in the light-shielding pattern 31 away from the flexible light-transmitting substrate 1 may not be absolutely planar. That is, the surface of the first sub-light-shielding pattern 311 away from the flexible light-transmitting substrate 1 may be uneven.

Based on this, the surface of the active layer 2111 proximate to the flexible light-transmitting substrate 1 is lower than the surface of the first sub-light-shielding pattern 311 away from the flexible light-transmitting substrate 1, which may mean that a distance (e.g., minimum distance) between the surface of the active layer 2111 proximate to the flexible light-transmitting substrate 1 and the flexible light-transmitting substrate 1 is less than a maximum distance between the surface of the first sub-light-shielding pattern 311 away from the flexible light-transmitting substrate 1 and the flexible light-transmitting substrate 1. In this way, at least a portion of the active layer 2111 may be ensured to be sunk into the space enclosed by the light-shielding pattern 31, so that the surface of the active layer 2111 proximate to the flexible light-transmitting substrate 1 and at least a portion of a lateral surface of the active layer 2111 may be shielded from light by using the light-shielding pattern 31.

Thus, in the display substrate 100 provided in some embodiments of the present disclosure, the plurality of sub-pixels 2 are disposed on the side of the flexible light-transmitting substrate 1, flexible display may be realized by using the flexible light-transmitting substrate 1, so that the application range of the display substrate 100 is expanded.

Moreover, the light-shielding layer 3 is disposed between the flexible light-transmitting substrate 1 and the plurality of sub-pixels 2, so that the light-shielding pattern 31 included in the light-shielding layer 3 is located only in the groove A of the flexible light-transmitting substrate 1. The active layer 2111 of the transistor 211 in the sub-pixel 2 is disposed in the groove A, and relative to the flexible light-transmitting substrate 1, the surface of the active layer 2111 proximate to the flexible light-transmitting substrate 1 is lower than the surface of the first light-shielding pattern 311 in the light-shielding pattern 31 away from the flexible light-transmitting substrate 1, so that the at least a portion of the active layer 2111 may be ensured to be sunk into the space enclosed by the light-shielding pattern 31. In this way, light incident on a portion of the flexible light-transmitting substrate 1 that is not provided with a light-shielding pattern 31 may be ensured to pass through the flexible light-transmitting substrate 1, so that the display substrate 100 may realize the flexible and transparent display. Light incident on a corresponding portion (i.e., a portion provided with the light-shielding pattern 31) of the flexible light-transmitting substrate 1 may be shielded by the light-shielding pattern 31. That is, at least part of light incident on the lateral surface of the active layer 2111 may be shielded by the first sub-light-shielding pattern 311, and light incident on the surface of the active layer 2111 proximate to the flexible light-transmitting substrate 1 may be shielded by the second sub-light-shielding pattern 312, so that the light-shielding pattern 31 has a large light-shielding range for the active layer 2111. Thus, an amount of light incident on the active layer 2111 may be effectively reduced to avoid affecting the carrier mobility of the transistor 211, thereby avoiding affecting the operating performance of the transistor 211, so that the display quality of the display substrate 100 is improved.

In addition, in the case where the transistor 211 is a top-gate transistor, light incident on a surface of the active layer 2111 away from the flexible light-transmitting substrate 1 may be shielded by the gate 2112, so that the gate 2112 may cooperate with the light-shielding pattern 31 to form a comprehensive light-shielding for the active layer 2111. Thus, the amount of light incident on the active layer 2111 is further reduced to avoid affecting the carrier mobility of the transistor 211, thereby further avoiding affecting the operating performance of the transistor 211, so that the display quality of the display substrate 100 is improved.

In some embodiments, as shown in FIGS. 5, 7 and 8, relative to the flexible light-transmitting substrate 1, the surface of the active layer 2111 away from the flexible light-transmitting substrate 1 is flush with or lower than the surface of the first sub-light-shielding pattern 311 away from the flexible light-transmitting substrate 1.

This means that a distance (e.g., maximum distance) between the surface of the active layer 2111 away to the flexible light-transmitting substrate 1 and the flexible light-transmitting substrate 1 is less than or equal to the maximum distance between the surface of the first sub-light-shielding pattern 311 away from the flexible light-transmitting substrate 1 and the flexible light-transmitting substrate 1. The active layer 2111 may be entirely sunk into the space enclosed by the light-shielding pattern 31.

In this way, the lateral surface of the active layer 2111 may be completely or relatively completely shielded from light by the first sub-light-shielding pattern 311, so as to prevent the light from being incident on the lateral surface of the active layer 2111, which further enlarges the light-shielding range of the lateral surface of the active layer 2111. Thus, the amount of light incident on the active layer 2111 may be further reduced to avoid the carrier mobility of the transistor 211, thereby further avoiding affecting the operating performance of the transistor 211, so that the display quality of the display substrate 100 is improved.

In some embodiments, as shown in FIGS. 4, 5, 7 and 8, an included angle between the first sub-light-shielding pattern 311 and the second sub-light-shielding pattern 312 in the light-shielding pattern 31 is greater than or equal to 90°.

In some examples, the light-shielding pattern 31 has a high thickness uniformity. The included angle between the first sub-light-shielding pattern 311 and the second sub-light-shielding pattern 312 may refer to an included angle between a surface of the first sub-light-shielding pattern 311 proximate to the side wall A1 of the groove A and a surface of the second sub-light-shielding pattern 312 proximate to the bottom surface A2 of the groove A, or an included angle between a surface of the first sub-light-shielding pattern 311 away from the side wall A1 of the groove A and a surface of the second sub-light-shielding pattern 312 away from the bottom surface A2 of the groove A.

In some other examples, the light-shielding pattern 31 has a low thickness uniformity. The included angle between the first sub-light-shielding pattern 311 and the second sub-light-shielding pattern 312 may refer to the included angle between the surface of the first sub-light-shielding pattern 311 proximate to the side wall A1 of the groove A and the surface of the second sub-light-shielding pattern 312 proximate to the bottom surface A2 of the groove A.

That is, the included angle between the first sub-light-shielding pattern 311 and the second sub-light-shielding pattern 312 is substantially equal to the included angle between the side wall A1 and the bottom surface A2 of the groove A.

It will be noted that if the light-shielding pattern is arranged as a planar structure, and is laid on the side of the flexible light-transmitting substrate 1, a large area of light-shielding pattern is required to enable the light-shielding pattern of the planar structure to shield the lateral surface of the active layer 2111 from light. However, in this way, a ratio of an area of the light-shielding pattern of the planar structure to an area of the flexible light-transmitting substrate 1 is increased, so that the light transmittance is reduced, and the flexible and transparent display effect is affected.

The light-shielding pattern 31 is arranged as the first sub-light-shielding pattern 311 and the second sub-light-shielding pattern 312 connected to each other, and the included angle between the first sub-light-shielding pattern 311 and the second sub-light-shielding pattern 312 is substantially equal to the included angle between the side wall A1 and the bottom surface A2 of the groove A, so that the at least a portion of the lateral surface of the active layer 2111 may be shielded from light by the first sub-light-shielding pattern 311 with a small area. Thus, a ratio of an area of an orthographic projection of the light-shielding pattern 31 on the flexible light-transmitting substrate 1 to the area of the flexible light-transmitting substrate 1 is reduced, so that the display substrate 100 is ensured to have a high light transmittance, thereby ensuring that the display substrate 100 has a good flexible and transparent display effect.

In some examples, in a direction Y perpendicular to the flexible light-transmitting substrate 1, a dimension component D of the first sub-light-shielding pattern 311 may be in a range of 1 μm to 3 μm, inclusive. For example, the dimension component D may be 1 μm, 1.5 μm, 2 μm, 2.6 μm, or 3 μm.

In this way, the first sub-light-shielding pattern 311 may have a small area to avoid reducing the light transmittance of the display substrate 100, and the at least a portion of the lateral surface of the active layer 2111 may be shielded from light.

Since the first-sub-light-shielding pattern 311 covers the side wall A1 of the groove A, in the direction perpendicular to the flexible light-transmitting substrate 1, the dimension component of the first sub-light-shielding pattern 311 may be substantially equal to a dimension component of the side wall A1 of the groove A. Accordingly, in the direction perpendicular to the flexible light-transmitting substrate 1, the dimension component of the side wall A1 of the groove A may be in a range of 1 μm to 3 μm, inclusive.

The thickness of the light-shielding layer 3 may be set according to actual needs. For example, the thickness of the light-shielding layer 3 may be in a range of 50 nm to 300 nm, inclusive. For example, the thickness of the light-shielding layer 3 may be 50 nm, 100 nm, 200 nm, 270 nm, or 300 nm.

In this way, the light-shielding effect of the light-shielding layer 3 may be ensured, the thickness of the display substrate 100 may be prevented from being increased, and an amount of a light-shielding material is reduced.

In some embodiments, the material of the light-shielding layer 3 varies, and may be set according to actual needs.

In some examples, the material of the light-shielding layer 3 may be a metal material. That is, the light-shielding layer 3 is a metal layer. In this case, the light-shielding layer 3 is grounded. In this way, the light-shielding layer 3 may be prevented from adversely affecting the active layer 2111.

For example, the material of the light-shielding layer 3 may be silver, copper, aluminum, or molybdenum.

In some other examples, the material of the light-shielding layer 3 may be a metal oxide, or an organic material.

For example, the material of the light-shielding layer 3 may be copper oxide, cuprous oxide, or silver peroxide. Alternatively, the material of the light-shielding layer 3 may be amorphous silicon. Alternatively, the material of the light-shielding layer 3 may be polystyrene, epoxy resin or polyacrylate doped with black particles (e.g., carbon, copper or chromium).

In some embodiments, as shown in FIGS. 4, 5, 7 and 8, the display substrate 100 may further include buffer layers 4 each disposed between a light-shielding pattern 311 and an active layer 2111. The buffer layer 4 covers a first-sub-light-shielding pattern 311 and a second-sub-light-shielding pattern 312. The active layer 2111 may be in direct contact with the buffer layer 4.

In some examples, orthographic projections of the first sub-light-shielding patterns 311 and the second sub-light-shielding patterns 312 on the flexible light-transmitting substrate 1 are located within an orthographic projection of the buffer layer 4 on the flexible light-transmitting substrate 1. The buffer layer 4 shields and protects the first sub-light-shielding pattern 311 and the second sub-light-shielding pattern 312, so as to prevent the light-shielding pattern 31 from being damaged in a process of forming a subsequent film (e.g., the active layer 2111 or the gate 2112).

For example, as shown in FIGS. 4, 5, 7 and 8, the buffer layers 4 are arranged as a whole layer. In this way, the buffer layers 4 shield and protect the first sub-light-shielding pattern 311 and the second sub-light-shielding pattern 312, and also shield and protect a surface of the flexible light-transmitting substrate 1, so as to prevent the flexible light-transmitting substrate 1 from being damaged in the processes of forming a subsequent film (e.g., the active layer 2111 or the gate 2112).

In some examples, as shown in FIGS. 4, 5, 7 and 8, in a direction X parallel to the flexible light-transmitting substrate 1, the first sub-light-shielding pattern 311 and the active layer 2111 have a minimum distanced therebetween.

For example, the minimum distanced is greater than or equal to the thickness of the buffer layer 4. In this way, the first sub-light-shielding pattern 311 and the active layer 2111 may be separated by the buffer layer 4. In a case where the light-shielding layer 3 a metal layer, the light-shielding layer 3 and the active layer 2111 may be insulated from each other by using the buffer layer 4.

For example, the thickness of the buffer layer 4 may be in a range of 300 nm to 1000 nm, inclusive. For example, the thickness of the buffer layer 4 may be 300 nm, 400 nm, 510 nm, 730 nm, or 1000 nm.

In some embodiments, as shown in FIGS. 5, 7 and 8, the display substrate 100 may further include a barrier layer 5 disposed between the flexible light-transmitting substrate 1 and the plurality of sub-pixels 2. The barrier layer 5 has a plurality of openings K, and the plurality of openings K expose the plurality of grooves A. The orthographic projection of the first sub-light-shielding pattern 311 on the flexible light-transmitting substrate 1 and an orthographic projection of the barrier layer 5 on the flexible light-transmitting substrate 1 are partially overlapped with each other, or have respective edges that are overlapped with each other.

In some examples, the barrier layer 5 is in a grid shape, and covers the surface of the flexible light-transmitting substrate 1 proximate to the plurality of sub-pixels 2. The barrier layer 5 exposes the plurality of grooves A only through the openings K. The plurality of openings K and the plurality of grooves A are in one-to-one correspondence. An edge, proximate to the flexible light-transmitting substrate 1, of a border of each opening K may, for example, coincide with an edge of a side wall A1 of a corresponding groove A away from the bottom surface A2.

In some examples, the barrier layer 5 is formed earlier than the light-shielding layer 3. In this way, after the light-shielding layer 3 is formed, at least a portion of the first sub-light-shielding pattern 311 in the light-shielding pattern 31 may be lapped on a portion of the barrier layer 5 close to the opening K, so that the orthographic projection of the first sub-light-shielding pattern 311 on the flexible light-transmitting substrate 1 is partially overlapped with the orthographic projection of the barrier layer 5 on the flexible light-transmitting substrate 1. Alternatively, the orthographic projection of the light-shielding layer 3 on the flexible light-transmitting substrate 1 is complementary to the orthographic projection of the barrier layer 5 on the flexible light-transmitting substrate 1. That is, the orthographic projection of the first sub-light-shielding pattern 311 on the flexible light-transmitting substrate 1 and the orthographic projection of the barrier layer 5 on the flexible light-transmitting substrate 1 have respective edges that are overlapped with each other.

Of course, a border of the orthographic projection of the first sub-light-shielding pattern 311 on the flexible light-transmitting substrate 1 and a border of the orthographic projection of the barrier layer 5 on the flexible light-transmitting substrate 1 are non-overlapped with each other, and have a distance therebetween.

In some examples, in a case where the display substrate 100 further includes the buffer layers 4, the barrier layer 5 is located between the flexible light-transmitting substrate 1 and the buffer layers 4. That is, the barrier layer 5 is formed earlier than the buffer layers 4.

Figure 9:
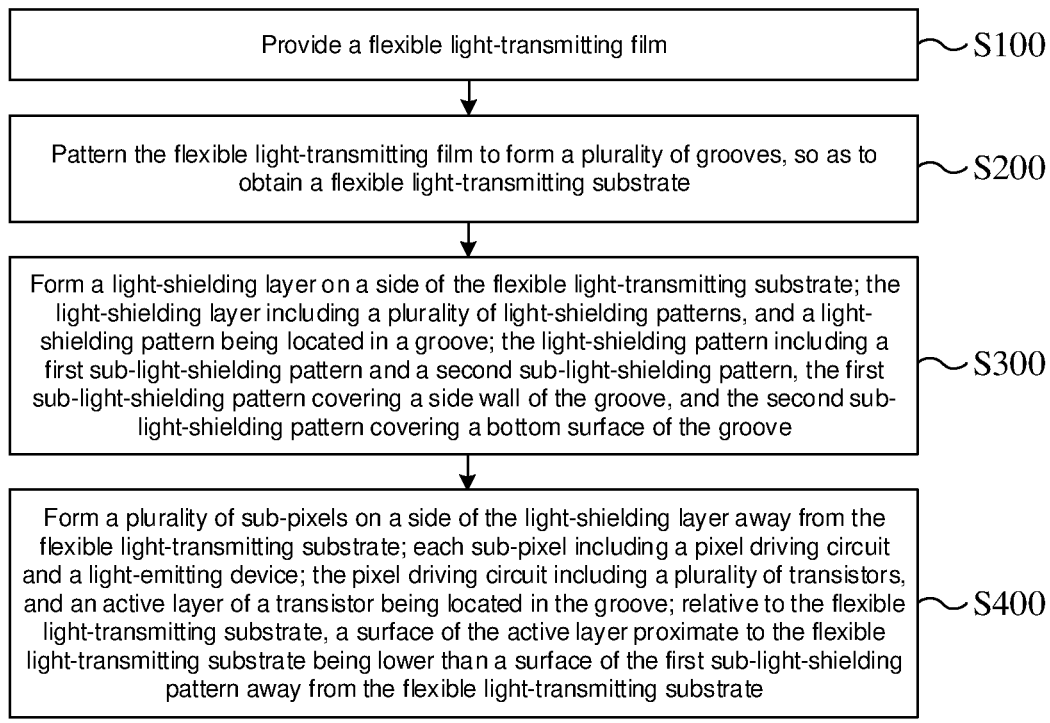
FIG. 9 is a flow diagram of a manufacturing method of a display substrate, in accordance with some embodiments of the present disclosure.

Some embodiments of the present disclosure provide a manufacturing method of a display substrate. As shown in FIG. 9, the manufacturing method includes S100 to S400.

In S100, a flexible light-transmitting film 1a is provided.

For example, the flexible light-transmitting film 1a may be made of colorless polyimide (CPI), polypropylene (PP), polyethylene (PE) or polystyrene (PS).

Figure 10:
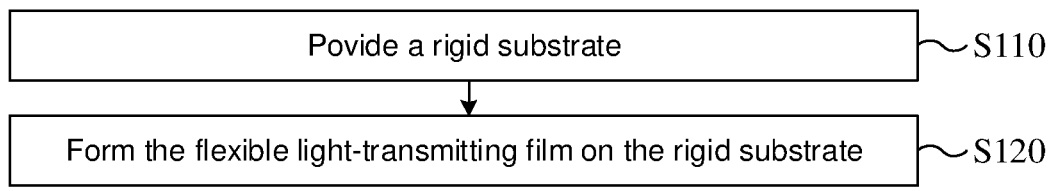
FIG. 10 is a flow diagram of S100 in the flow diagram shown in FIG. 9.

In some examples, as shown in FIG. 10, in S100, providing the flexible light-transmitting film 1a may include S110 and S120.

In S110, a rigid substrate 1b is provided.

A material of the rigid substrate 1b varies, and may be set according to actual needs, as long as the rigid substrate 1b is capable of forming a stable support for the subsequently formed flexible light-transmitting film 1a, and the flexible light-transmitting substrate 1 will not be damaged in a subsequent process of removing the rigid substrate 1b.

For example, the rigid substrate 1b may be, for example, a glass substrate or a polymethyl methacrylate (PMMA) substrate.

Figure 15A:
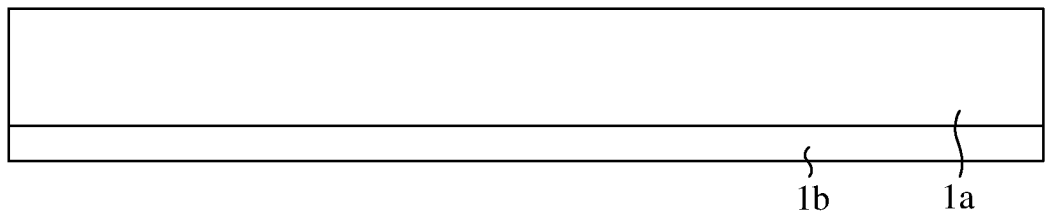
FIGS. 15a to 15n are diagrams showing steps of manufacturing a display substrate, in accordance with some embodiments of the present disclosure.

In S120, as shown in FIG. 15a, the flexible light-transmitting film 1a is formed on the rigid substrate 1b.

For example, based on that the flexible light-transmitting film 1a is made of an organic material, in a process of forming the flexible light-transmitting film 1a, a coating process (e.g., a spraying coating process or a spin coating process) and a curing process (e.g., a UV curing process) may be sequentially used. The thickness of the flexible light-transmitting film 1a is, for example, greater than or equal to 6 μm.

The flexible light-transmitting film 1*a* has a good flexibility. The flexible light-transmitting film 1*a* is formed on the rigid substrate 1*b*, so that the rigid substrate 1*b* may form a stable support for the flexible light-transmitting film 1*a*, so as to avoid bending of the flexible light-transmitting film 1*a* in a subsequent patterning process. Thus, an accuracy of the size and shape of the subsequently formed groove A may be ensured to improve a yield of the display substrate 100.

In S200, the flexible light-transmitting film 1*a* is patterned to form a plurality of grooves A, so as to obtain a flexible light-transmitting substrate 1.

Here, a method of patterning the flexible light-transmitting film 1*a* to form the plurality of grooves A varies, and may be set according to actual needs.

Figure 11:
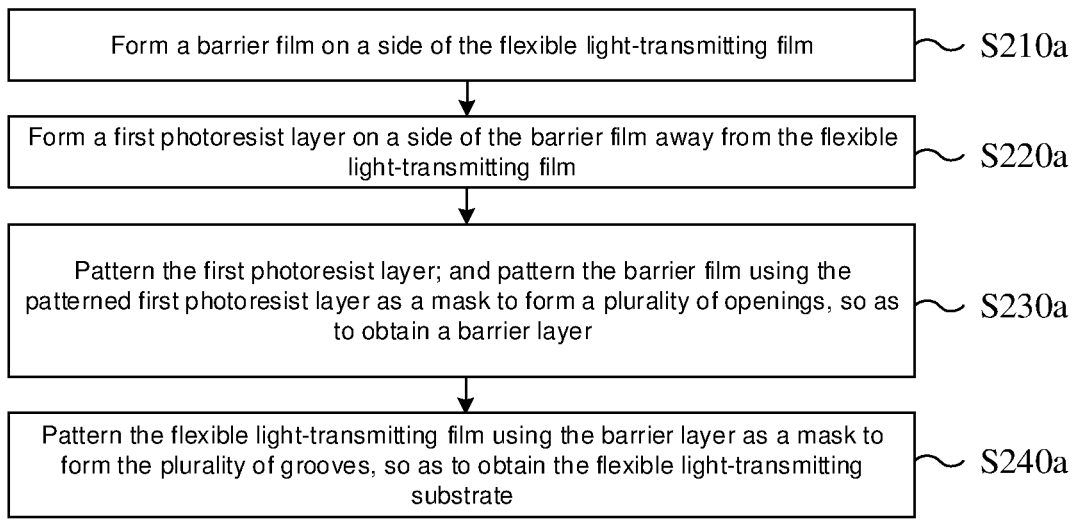
FIG. 11 is a flow diagram of S200 in the flow diagram shown in FIG. 9.

In some examples, as shown in FIG. 11, patterning the flexible light-transmitting film 1*a* to form the plurality of grooves A includes S210*a* to S240*a*.

Figure 15B:
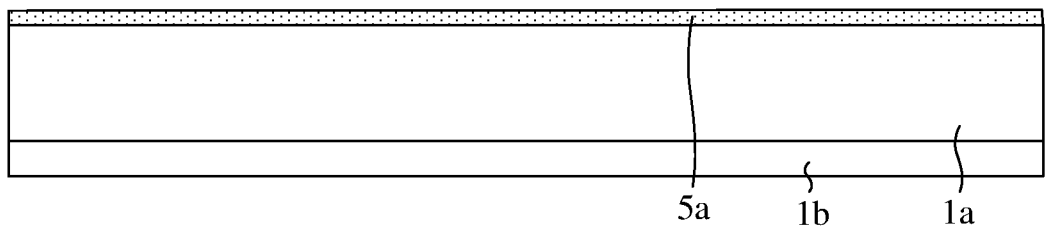

In S210*a*, as shown in FIG. 15*b*, a barrier film 5*a* is formed on a side of the flexible light-transmitting film 1*a*.

For example, the barrier film 5*a* is made of an inorganic material. For example, the inorganic material may be silicon nitride (SiN) or silicon dioxide ($SiO_2$).

For example, the barrier film 5*a* may be formed by using a plasma enhanced chemical vapor deposition (PECVD) process.

In the process of patterning the flexible light-transmitting film 1*a*, a photolithography process may be used. Since the flexible light-transmitting film 1*a* is made of the organic material, it is difficult to etch the flexible light-transmitting film 1*a* using a photoresist layer with a pattern as a mask.

The barrier film 5*a* is formed on the side of the flexible light-transmitting film 1*a*, so that the flexible light-transmitting film 1*a* and a subsequently formed photoresist may be separated by the barrier film 5*a*, so as to pattern the flexible light-transmitting film 1*a* by using the photolithography process.

Figure 15C:
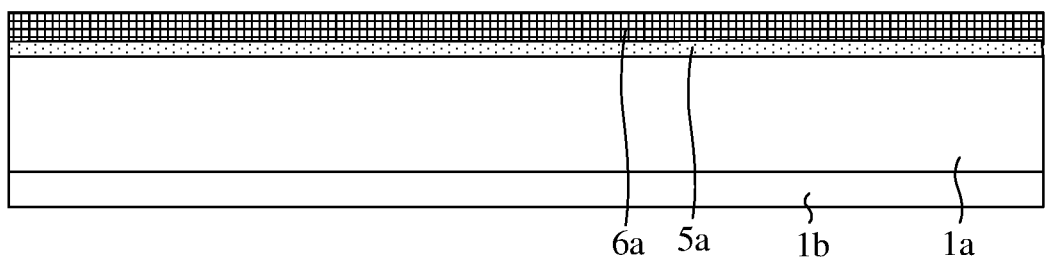

In S220*a*, as shown in FIG. 15*c*, a first photoresist layer 6*a* is formed on a side of the barrier film 5*a* away from the flexible light-transmitting film 1*a*.

For example, the first photoresist layer 6*a* may be formed by using a coating process (e.g., a spray coating process or a spin coating process). The first photoresist layer 6*a* is made of, for example, a positive photoresist.

Figure 15D:
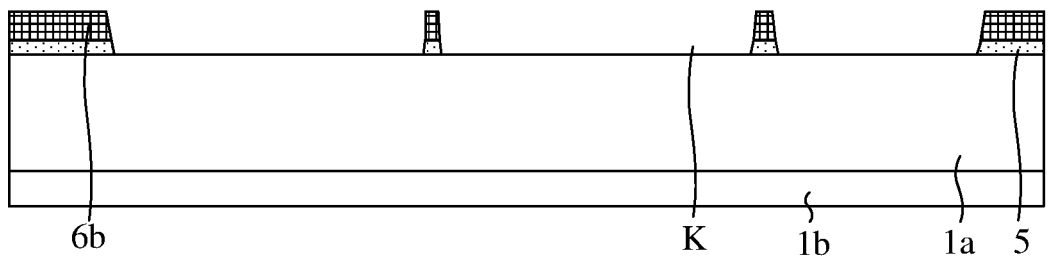

In S230*a*, as shown in FIG. 15*d*, the first photoresist layer 6*a* is patterned; and the barrier film 5*a* is patterned using the patterned first photoresist layer 6*b* as a mask to form a plurality of openings K, so as to obtain a barrier layer 5.

For example, in a process of patterning the first photoresist layer 6*a*, a mask may be provided on a side of the first photoresist layer 6*a* away from the barrier film 5*a*, and the mask has a pattern having the same shape as a top view of a respective groove A to be formed. Then, the first photoresist layer 6*a* is exposed through the mask. Then, the first photoresist layer 6*a* is developed, and exposed portions of the first photoresist layer 6*a* are removed to obtain the patterned first photoresist layer 6*b*. The patterned first photoresist layer 6*b* exposes portions of the barrier film 5*a*, and positions where the portions are located respectively correspond to positions where the grooves A to be formed are located.

For example, after the patterned first photoresist layer 6*b* is obtained, the barrier film 5*a* may be patterned (i.e., etched) using the patterned first photoresist layer 6*b* as the mask to remove the portions of the barrier film 5*a* exposed by the patterned first photoresist layer 6*b*, so as to form the plurality of openings K, so that the barrier layer 5 is obtained.

After the barrier layer 5 is obtained, for example, the patterned first photoresist layer 6*b* may be removed.

Figure 15E:
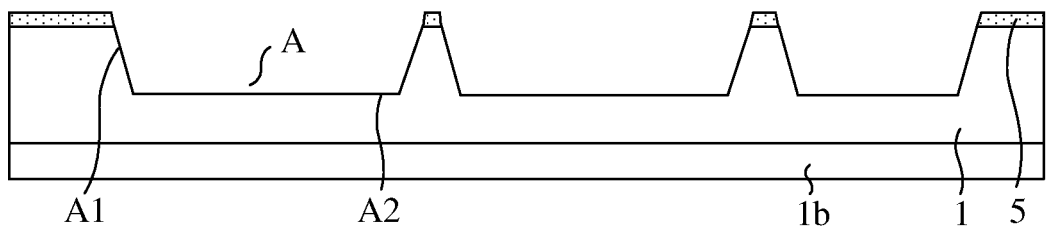

In S240*a*, as shown in FIG. 15*e*, the flexible light-transmitting film 1*a* is patterned using the barrier layer 5 as a mask to form the plurality of grooves A, so as to obtain the flexible light-transmitting substrate 1.

The plurality of openings K in the barrier layer 5 respectively expose portions of the flexible light-transmitting film 1*a*, and the portions respectively correspond to the positions where the grooves A to be formed are located.

After the barrier layer 5 is obtained, the flexible light-transmitting film 1*a* may be patterned (i.e., etched) using the barrier layer 5 as the mask to remove the portions of the flexible light-transmitting film 1*a* respectively exposed by the plurality of openings K, so as to form the plurality of grooves A, so that the flexible light-transmitting substrate 1 is obtained.

For example, an etch depth of the flexible light-transmitting film 1*a* may be determined according to a dimension of the groove A to be formed in the direction perpendicular to the flexible light-transmitting substrate 1.

For example, in the direction perpendicular to the flexible light-transmitting substrate 1, the dimension of the groove A may be in a range of 1 μm to 3 μm, inclusive. A ratio of this dimension to the thickness of the flexible light-transmitting film 1*a* is less than or equal to 1/2, which may not only avoid affecting an overall structural stability of the flexible light-transmitting substrate 1, but also ensure that a subsequently formed light-shielding layer 3 is capable of forming a good light-shielding effect on the active layers 2111 of the transistors 211.

Figure 12:
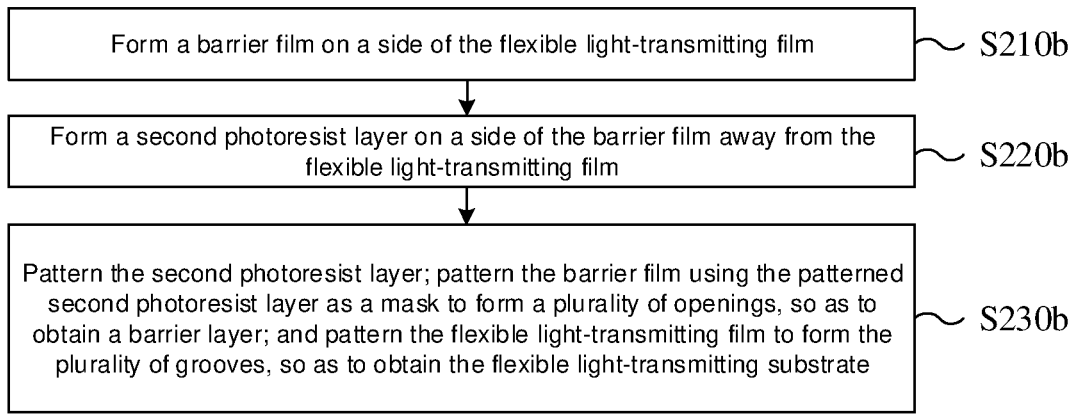
FIG. 12 is another flow diagram of S200 in the flow diagram shown in FIG. 9.

In some other examples, as shown in FIG. 12, patterning the flexible light-transmitting film 1*a* to form the plurality of grooves A includes S210*b* to S230*b*.

In S210*b*, as shown in FIG. 15*b*, a barrier film 5*a* is formed on a side of the flexible light-transmitting film 1*a*.

A description of S210*b* may refer to S210*a* described above, and will not be repeated here.

Figure 16A:
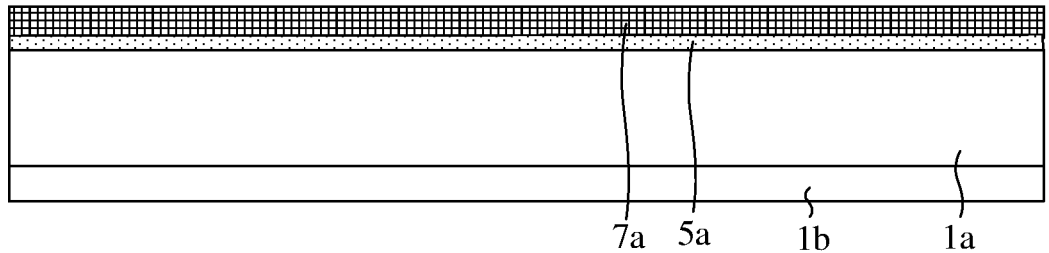
FIGS. 16a to 16c are diagrams showing steps of manufacturing a light-shielding layer, in accordance with some embodiments of the present disclosure.

In S220*b*, as shown in FIG. 16*a*, a second photoresist layer 7*a* is formed on a side of the barrier film 5*a* away from the flexible light-transmitting film 1*a*.

For example, the second photoresist layer 7*a* may be formed by using a coating process. The second photoresist layer 7*a* is made of, for example, a positive photoresist.

Figure 16B:
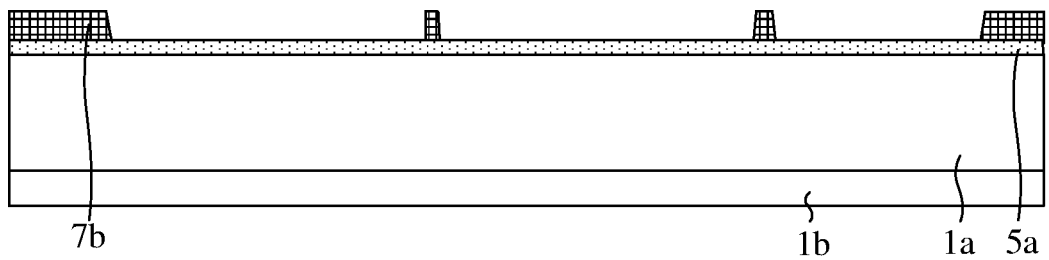
Figure 16C:
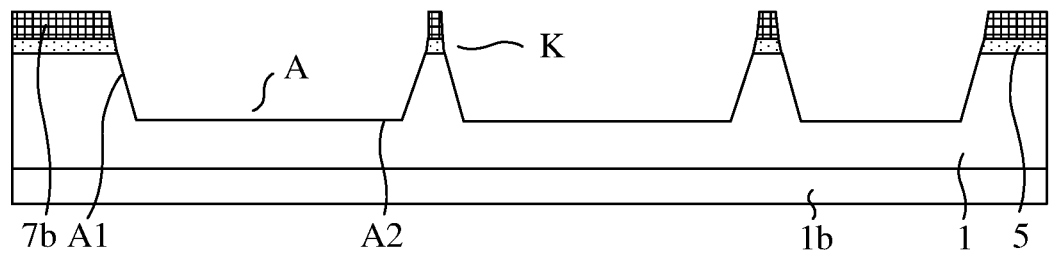

In S230*b*, as shown in FIGS. 16*b* and 16*c*, the second photoresist layer 7*a* is patterned; the barrier film 5*a* is patterned using the patterned second photoresist layer 7*b* as a mask to form a plurality of openings K, so as to obtain a barrier layer 5; and the flexible light-transmitting film 1*a* is patterned to form the plurality of grooves A, so as to obtain the flexible light-transmitting substrate 1.

A process of patterning the second photoresist layer 7*a* may refer to the process of patterning the first photoresist layer 6*a* in S230*a*, and will not be repeated here.

For example, after the patterned second photoresist layer 7*b* is obtained, the barrier film 5*a* and the flexible light-transmitting film 1*a* are patterned (i.e., etched) synchronously using the patterned second photoresist layer 7*b* as the mask. That is, the barrier film 5*a* and the flexible light-transmitting film 1*a* may be etched in a same etching process, so as to obtain the barrier layer 5 and the flexible light-transmitting substrate 1 in sequence.

Here, in a process of patterning the barrier film 5*a* and the flexible light-transmitting film 1*a*, the patterned second photoresist layer 7*b* needs to be retained.

In S300, a light-shielding layer 3 is formed on a side of the flexible light-transmitting substrate 1. The light-shielding layer 3 includes a plurality of light-shielding patterns 31, and a light-shielding pattern 31 is located in a groove A. The light-shielding pattern 31 includes a first sub-light-shielding pattern 311 and a second sub-light-shielding pattern 312. The first sub-light-shielding pattern 311 covers a side wall A1 of the groove A, and the second sub-light-shielding pattern 312 covers a bottom surface A2 of the groove A.

Figure 13:
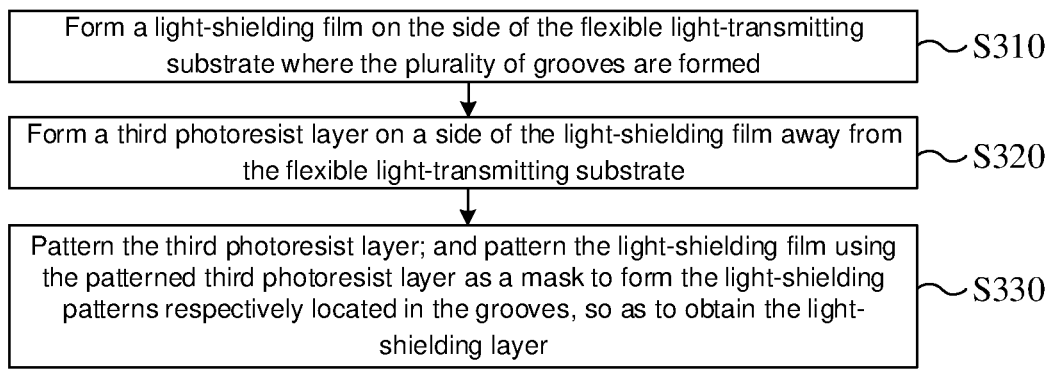
FIG. 13 is a flow diagram of S300 in the flow diagram shown in FIG. 9.

In some examples, as shown in FIG. 13, in S300, forming the light-shielding layer 3 on the side of the flexible light-transmitting substrate 1 includes S310 to S330.

Figure 15F:
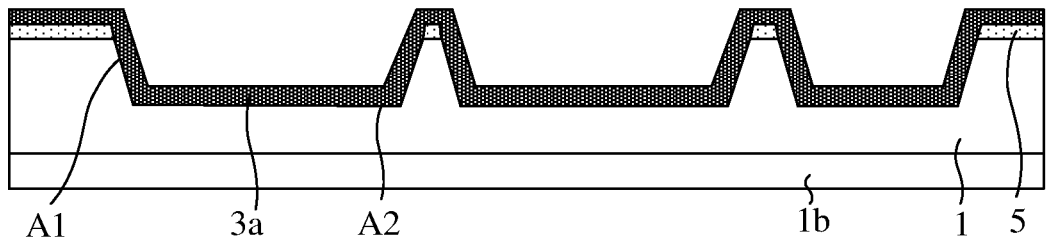

In S310, as shown in FIG. 15f, a light-shielding film 3a is formed on the side of the flexible light-transmitting substrate 1 where the plurality of grooves A are formed.

For example, in a case where the light-shielding film 3a is made of a metal material, the light-shielding film 3a may be formed by using a magnetron sputtering process. In a case where the light-shielding film 3a is made of an inorganic material, the light-shielding film 3a may be formed by using a PECVD process. In a case where the light-shielding film 3a is made of an organic material, the light-shielding film 3a may be formed by using a coating process.

The light-shielding film 3a covers the plurality of grooves A, and covers at least a portion of the barrier layer 5.

Figure 15G:
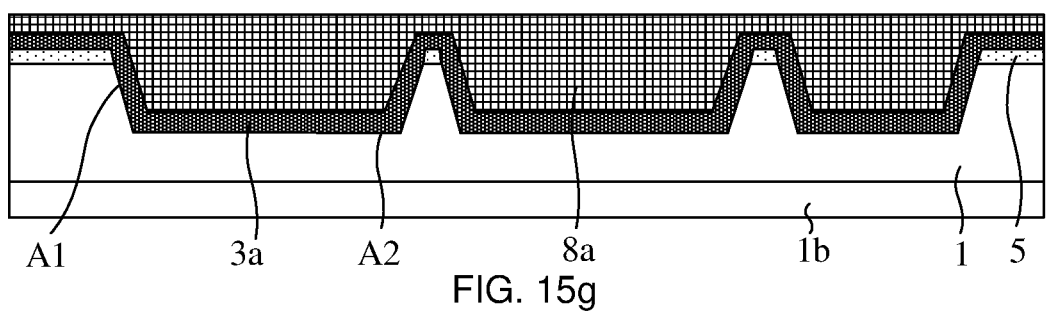

In S320, as shown in FIG. 15g, a third photoresist layer 8a is formed on a side of the light-shielding film 3a away from the flexible light-transmitting substrate 1.

For example, the third photoresist layer 8a may be formed by using a coating process. The third photoresist layer 8a is made of, for example, a positive photoresist.

Figure 15H:
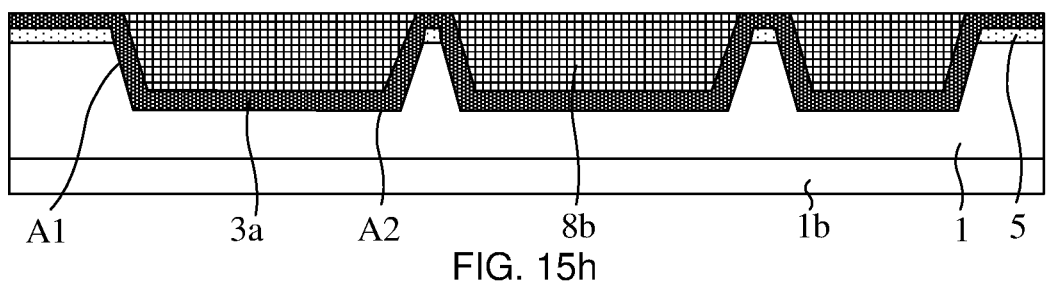
Figure 15I:
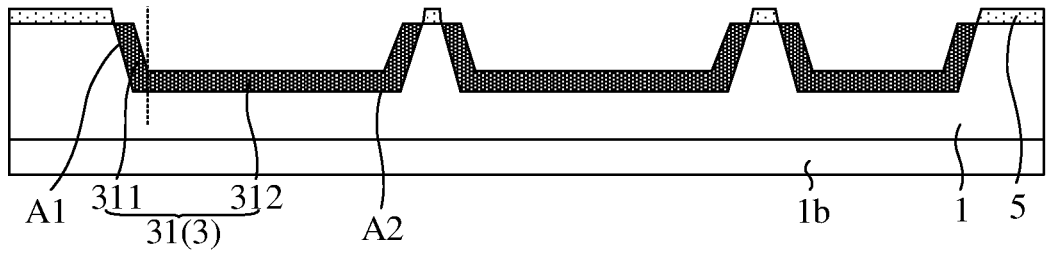

In S330, as shown in FIGS. 15h and 15i, the third photoresist layer 8a is patterned; and the light-shielding film 3a is patterned using the patterned third photoresist layer 8b as a mask to form the light-shielding patterns 31 respectively located in the grooves, so as to obtain the light-shielding layer 3.

For example, in a process of patterning the third photoresist layer 8a, a mask may be provided on a side of the third photoresist layer 8a away from the flexible light-transmitting substrate 1, and the mask has a pattern complementary to the shape of the light-shielding layer to be formed. Then, the third photoresist layer 8a is exposed through the mask. Then, the third photoresist layer 8a is developed, and exposed portions of the third photoresist layer 8a are removed to obtain the patterned third photoresist layer 8b. The patterned third photoresist layer 8b protects and shields a portion of the light-shielding film 3a located in the grooves A.

For example, after the patterned third photoresist layer 8b is obtained, the light-shielding film 3a may be patterned (i.e., etched) using the patterned third photoresist layer 8b as the mask to remove a portion of the light-shielding film 3a that is not shielded and protected by the patterned third photoresist layer 8b, so that the portion of the light-shielding film 3a that is shielded and protected by the patterned third photoresist layer 8b is retained, and including a plurality of patterns each located in a groove A. In this way, the light-shielding layer 3 including the plurality of light-shielding patterns 31 is obtained.

A shape and a structure of the light-shielding pattern 31 may refer to the description in some of the above embodiments, and will not be repeated here.

In S400, a plurality of sub-pixels 2 are formed on a side of the light-shielding layer 3 away from the flexible light-transmitting substrate 1. Each sub-pixel 2 includes a pixel driving circuit 21 and a light-emitting device 22. The pixel driving circuit 21 includes a plurality of transistors 211, and an active layer 2111 of a transistor 211 is located in the groove A. Relative to the flexible light-transmitting substrate 1, a surface of the active layer 2111 proximate to the flexible light-transmitting substrate 1 is lower than a surface of the first sub-light-shielding pattern 311 away from the flexible light-transmitting substrate 1.

Figure 15J:
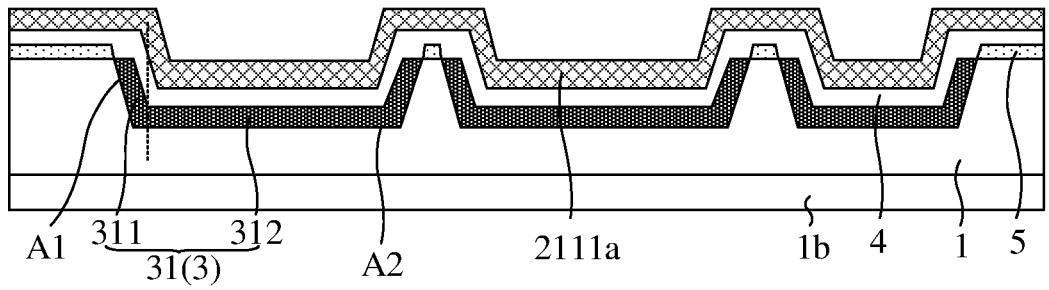

For example, as shown in FIG. 15j, before the plurality of sub-pixels 2 are formed, the manufacturing method of the display substrate further includes: forming buffer layers 4 on the side of the light-shielding layer 3 away from the flexible light-transmitting substrate 1.

For example, the buffer layers 4 may be formed by using a PECVD process.

A shape and a structure of the buffer layers 4 may refer to the description in some of the above embodiments, and will not be repeated here.

Figure 14:
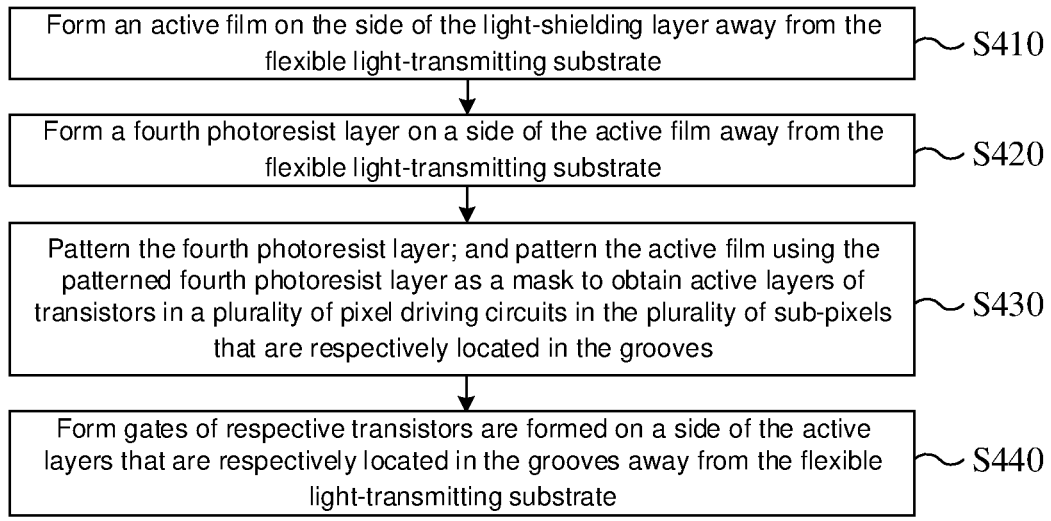
FIG. 14 is a flow diagram of S400 in the flow diagram shown in FIG. 9.

In some examples, as shown in FIG. 14, in S400, forming the plurality of sub-pixels 2 on the side of the light-shielding layer 3 away from the flexible light-transmitting substrate 1 includes S410 to S430.

In S410, as shown in FIG. 15j, an active film 2111a is formed on the side of the light-shielding layer 3 away from the flexible light-transmitting substrate 1.

For example, three films that are stacked in sequence may be formed by using a PECVD process, and the three films constitute the active film 2111a. The active film 2111a covers the light-shielding layer 3 and a portion of the flexible light-transmitting substrate 1 uncovered by the light-shielding layer 3.

For example, in the three films, a film is made of silicon nitride (SiN), another film is made of silicon oxide (SiO), and yet another film is made of amorphous silicon (a-Si).

Figure 15K:
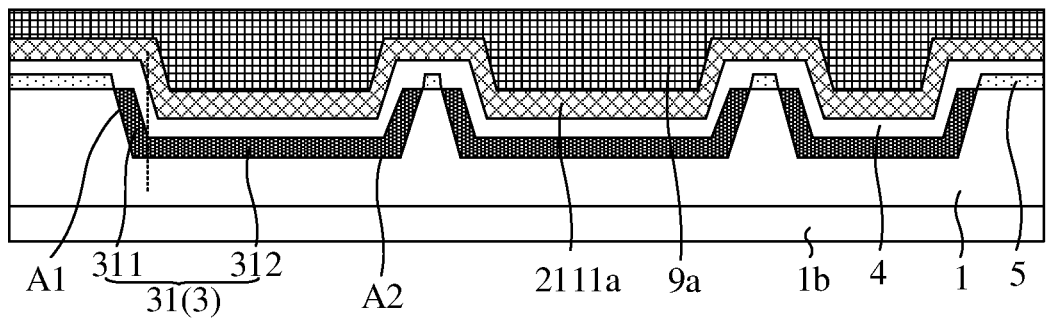

In S420, as shown in FIG. 15k, a fourth photoresist layer 9a is formed on a side of the active film 2111a away from the flexible light-transmitting substrate 1.

For example, the fourth photoresist layer 9a may be formed by using a coating process. The fourth photoresist layer 9a is made of, for example, a positive photoresist.

Figure 15L:
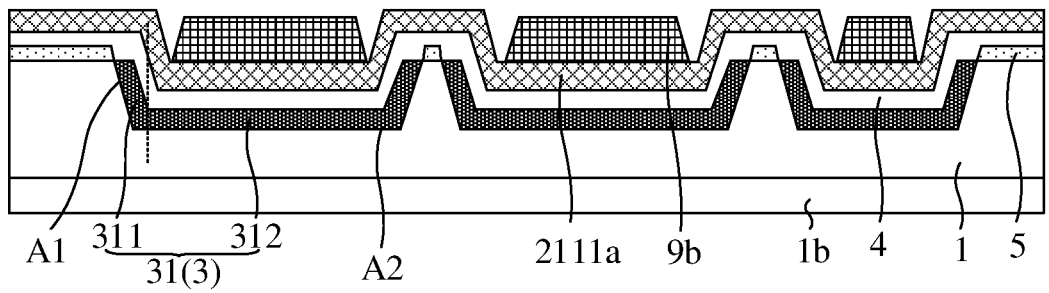
Figure 15M:
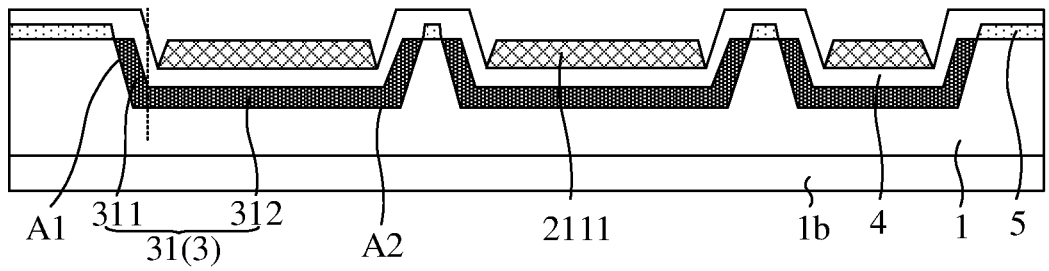

In S430, as shown in FIGS. 15l and 15m, the fourth photoresist layer 9a is patterned; and the active film 2111a is patterned using the patterned fourth photoresist layer 9b as a mask to obtain active layers 2111 of transistors 211 in a plurality of pixel driving circuits 21 in the plurality of sub-pixels 2 that are respectively located in the grooves A.

For example, a process of patterning the fourth photoresist layer 9a in S430 is the same as the process of patterning the third photoresist layer 8a in S330, and a process of patterning the active film 2111a in S430 is the same as the process of patterning the light-shielding film 3a in S330, which may refer to the description in S330 for details, and will not be repeated here.

A shape, a structure, and an arrangement of the active layers 2111 may refer to the description in some of the above embodiments, and will not be repeated here.

In some examples, as shown in FIG. 14, in S400, forming the plurality of sub-pixels 2 on the side of the light-shielding layer 3 away from the flexible light-transmitting substrate 1 further includes S440.

Figure 15N:
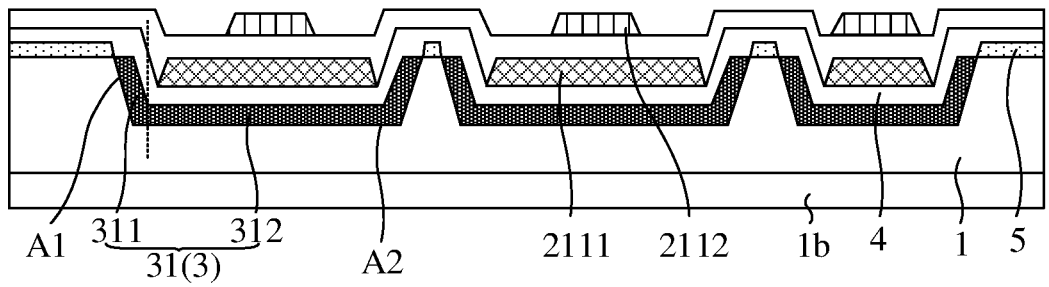

In S440, as shown in FIG. 15n, gates 2112 of respective transistors 211 are formed on a side of the active layers 2111 that are respectively located in the grooves A away from the flexible light-transmitting substrate 1.

For example, the gates 2112 may be formed by sequentially using a magnetron sputtering process and a photolithography process.

After the gates 2112 are formed, sources 2113 and drains 2114 of the transistors 2111 in the plurality of pixel driving circuits 21, and light-emitting devices 22 in the plurality of sub-pixels 2 may be sequentially formed.

Beneficial effects that may be achieved by the manufacturing method of the display substrate provided in some embodiments of the present disclosure are the same as the beneficial effects that may be achieved by the display substrate 100 provided in some of the above embodiments, and will not be repeated herein.

In some embodiments, the manufacturing method of the display substrate further includes: removing the rigid substrate 1b after the plurality of sub-pixels 2 are formed.

For example, the rigid substrate 1b may be removed by using a laser lift-off technique. After the rigid substrate 1b is removed, the display substrate 100 with the flexible and transparent display function may be obtained.

Figure 17:
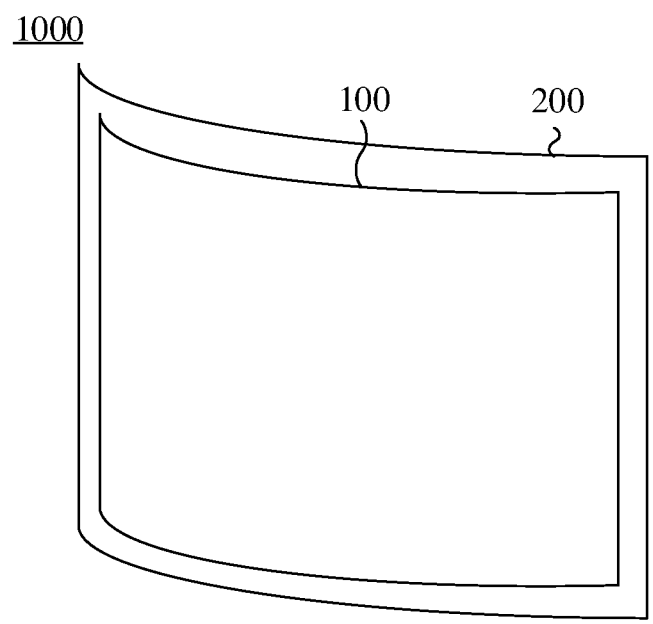
FIG. 17 is a structural diagram of a display device, in accordance with some embodiments of the present disclosure.

Some embodiments of the present disclosure provide a display device 1000. As shown in FIG. 17, the display device 1000 includes the display substrate 100 in any one of the above embodiments.

For example, as shown in FIG. 17, the display device 1000 may further include a carrier frame 200. The carrier frame may carry the display substrate 100.

Beneficial effects that may be achieved by the display device 1000 provided in some embodiments of the present disclosure are the same as the beneficial effects that may be achieved by the display substrate 100 provided in some of the above embodiments, and will not be repeated herein.

In some embodiments, the display device 1000 may be any device that displays images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal digital assistants (PDAs), hand-held or portable computers, global positioning system (GPS) receivers/navigators, cameras, moving picture experts group 4 (MP4) video players, camcorders, game consoles, watches, clocks, calculators, television monitors, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
a flexible light-transmitting substrate; a side of the flexible light-transmitting substrate having a plurality of grooves;
a light-shielding layer disposed on the side of the flexible light-transmitting substrate;
wherein the light-shielding layer includes a plurality of light-shielding patterns, and a light-shielding pattern in the plurality of light-shielding patterns is located in a groove in the plurality of grooves; the light-shielding pattern includes a first sub-light-shielding pattern and a second sub-light-shielding pattern, the first sub-light-shielding pattern covers a side wall of the groove, and the second sub-light-shielding pattern covers a bottom surface of the groove; and
a plurality of sub-pixels disposed on a side of the light-shielding layer away from the flexible light-transmitting substrate; each sub-pixel including a pixel driving circuit and a light-emitting device;
wherein the pixel driving circuit includes a plurality of transistors, and an active layer of a transistor in the plurality of transistors is located in the groove; relative to the flexible light-transmitting substrate, a surface of the active layer proximate to the flexible light-transmitting substrate is lower than a surface of the first sub-light-shielding pattern away from the flexible light-transmitting substrate.

2. The display substrate according to claim 1, wherein relative to the flexible light-transmitting substrate, a surface of the active layer away from the flexible light-transmitting substrate is flush with or lower than the surface of the first sub-light-shielding pattern away from the flexible light-transmitting substrate.

3. The display substrate according to claim 1, wherein the groove is provided with a plurality of active layers therein; and
the plurality of active layers belong to transistors in at least one pixel driving circuit.

4. The display substrate according to claim 1, wherein an included angle between the first sub-light-shielding pattern and the second sub-light-shielding pattern is greater than or equal to 90°.

5. The display substrate according to claim 1, further comprising a barrier layer disposed between the flexible light-transmitting substrate and the plurality of sub-pixels; wherein
the barrier layer has a plurality of openings, and the plurality of openings expose the plurality of grooves, respectively; and
an orthographic projection of the first sub-light-shielding pattern on the flexible light-transmitting substrate and an orthographic projection of the barrier layer on the flexible light-transmitting substrate are partially overlapped with each other, or have respective edges that are overlapped with each other.

6. The display substrate according to claim 1, wherein the light-shielding layer includes a metal layer; and
the light-shielding layer is grounded.

7. The display substrate according to claim 1, further comprising a buffer layer disposed between the light-shielding pattern and the active layer; wherein
the buffer layer covers the first sub-light-shielding pattern and the second sub-light-shielding pattern; and
in a direction parallel to the flexible light-transmitting substrate, the first sub-light-shielding pattern and the active layer have a minimum distance therebetween; and the minimum distance is greater than or equal to a thickness of the buffer layer.

8. The display substrate according to claim 1, wherein a gate of the transistor is located on a side of the active layer of the transistor away from the flexible light-transmitting substrate.

9. A manufacturing method of a display substrate, comprising:
providing a flexible light-transmitting film;
patterning the flexible light-transmitting film to form a plurality of grooves, so as to obtain a flexible light-transmitting substrate;

forming a light-shielding layer on a side of the flexible light-transmitting substrate;

wherein the light-shielding layer includes a plurality of light-shielding patterns, and a light-shielding pattern in the plurality of light-shielding patterns is located in a groove in the plurality of grooves; the light-shielding pattern includes a first sub-light-shielding pattern and a second sub-light-shielding pattern, the first sub-light-shielding pattern covers a side wall of the groove, and the second sub-light-shielding pattern covers a bottom surface of the groove; and forming a plurality of sub-pixels on a side of the light-shielding layer away from the flexible light-transmitting substrate; each sub-pixel including a pixel driving circuit and a light-emitting device;

wherein the pixel driving circuit includes a plurality of transistors, and an active layer of a transistor in the plurality of transistors is located in the groove; relative to the flexible light-transmitting substrate, a surface of the active layer proximate to the flexible light-transmitting substrate is lower than a surface of the first sub-light-shielding pattern away from the flexible light-transmitting substrate.

10. The manufacturing method of the display substrate according to claim 9, wherein patterning the flexible light-transmitting film to form the plurality of grooves includes:

forming a barrier film on a side of the flexible light-transmitting film;

forming a first photoresist layer on a side of the barrier film away from the flexible light-transmitting film;

patterning the first photoresist layer;— patterning the barrier film using the patterned first photoresist layer as a mask to form a plurality of openings, so as to obtain a barrier layer; and patterning the flexible light-transmitting film using the barrier layer as a mask to form the plurality of grooves, so as to obtain the flexible light-transmitting substrate.

11. The manufacturing method of the display substrate according to claim 9, wherein patterning the flexible light-transmitting film to form the plurality of grooves includes:

forming a barrier film on a side of the flexible light-transmitting film;

forming a second photoresist layer on a side of the barrier film away from the flexible light-transmitting film;

patterning the second photoresist layer;— patterning the barrier film using the patterned second photoresist layer as a mask to form a plurality of openings, so as to obtain a barrier layer; and— patterning the flexible light-transmitting film to form the plurality of grooves, so as to obtain the flexible light-transmitting substrate.

12. The manufacturing method of the display substrate according to claim 9, wherein forming the light-shielding layer on the side of the flexible light-transmitting substrate includes:

forming a light-shielding film on the side of the flexible light-transmitting substrate where the plurality of grooves are formed;

forming a third photoresist layer on a side of the light-shielding film away from the flexible light-transmitting substrate;

patterning the third photoresist layer; and— patterning the light-shielding film using the patterned third photoresist layer as a mask to form the light-shielding patterns respectively located in the grooves, so as to obtain the light-shielding layer.

13. The manufacturing method of the display substrate according to claim 9, wherein providing the flexible light-transmitting film includes:

providing a rigid substrate; and forming the flexible light-transmitting film on the rigid substrate;

the manufacturing method of the display substrate further comprises:

removing the rigid substrate after the plurality of sub-pixels are formed.

14. The manufacturing method of the display substrate according to claim 9, wherein forming the plurality of sub-pixels on the side of the light-shielding layer away from the flexible light-transmitting substrate includes:

forming an active film on the side of the light-shielding layer away from the flexible light-transmitting substrate;

forming a fourth photoresist layer on a side of the active film away from the flexible light-transmitting substrate;

patterning the fourth photoresist layer; and— patterning the active film using the patterned fourth photoresist layer as a mask to obtain active layers of transistors in a plurality of pixel driving circuits in the plurality of sub-pixels that are respectively located in the grooves.

15. The manufacturing method of the display substrate according to claim 14, wherein forming the plurality of sub-pixels on the side of the light-shielding layer away from the flexible light-transmitting substrate further includes:

forming gates of respective transistors on a side of the active layers that are respectively located in the grooves away from the flexible light-transmitting substrate.

16. A display device, comprising the display substrate according to claim 1.

17. The display substrate according to claim 1, wherein a number of the light-shielding patterns is less than or equal to a number of the grooves.

18. The display substrate according to claim 1, wherein a shape of the light-shielding pattern is substantially same as a shape of the groove.

19. The display substrate according to claim 1, wherein in a direction perpendicular to the flexible light-transmitting substrate, a dimension component of the first sub-light-shielding pattern is in a range of 1 μm to 3 μm, inclusive.

20. The display substrate according to claim 1, wherein a thickness of the light-shielding layer is in a range of 50 nm to 300 nm, inclusive.

* * * * *